(12) United States Patent
Katayama

(10) Patent No.: US 8,592,533 B2
(45) Date of Patent: Nov. 26, 2013

(54) THERMOSETTING COMPOSITION

(75) Inventor: Hiroyuki Katayama, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 747 days.

(21) Appl. No.: 12/419,618

(22) Filed: Apr. 7, 2009

(65) Prior Publication Data
US 2009/0283719 A1 Nov. 19, 2009

(30) Foreign Application Priority Data

May 15, 2008 (JP) .................................. 2008-128679

(51) Int. Cl.
C08F 283/00 (2006.01)
C08F 283/12 (2006.01)
C08G 77/00 (2006.01)

(52) U.S. Cl.
USPC ............................ 525/477; 525/475; 525/476

(58) Field of Classification Search
USPC ......................................... 525/475, 476, 477
See application file for complete search history.

(56) References Cited

U.S. PATENT DOCUMENTS 5,492,968 A * 2/1996 Nakai et al. .................... 525/101
5,614,654 A * 3/1997 Miyake et al. .................. 556/10
7,276,562 B2 * 10/2007 Kashiwagi et al. ........... 525/476
2004/0244649 A1 12/2004 Kato et al.
2007/0142574 A1 * 6/2007 Kodama ........................ 525/476
2008/0207848 A1 * 8/2008 Morita et al. ................. 525/475

FOREIGN PATENT DOCUMENTS

| DE | 27 19 091 A1 | 1/1978 | |
| JP | 4-45129 | 2/1992 | |
| JP | 2003165841 A * | 6/2003 | ............ C08G 77/58 |
| JP | 2007-332314 | 12/2007 | |
| TW | 200540198 | 12/2005 | |
| WO | WO 2005123826 A1 * | 12/2005 | ............... C08K 9/06 |
| WO | WO 2006038638 A1 * | 4/2006 | |

OTHER PUBLICATIONS

U.S. Appl. No. 12/549,956, filed Aug. 28, 2009, Katayama.
U.S. Appl. No. 12/553,227, filed Sep. 3, 2009, Katayama.
Chinese Office Action issued Aug. 20, 2012, in China patent Application No. 200910138911.X.
Office Action issued Dec. 25, 2012 in Japanese Patent Application No. 2008-128679.
Office Action issued on Nov. 24, 2011 in the corresponding Chinese Patent Application No. 200910138911.X (with English Translation).

\* cited by examiner

*Primary Examiner* — Michael L Leonard
(74) *Attorney, Agent, or Firm* — Oblon, Spivak, McClelland, Maier & Neustadt, L.L.P.

(57) ABSTRACT

A thermosetting composition containing an aluminosiloxane and an epoxy silicone. The thermosetting composition of the present invention is suitably used for, for example, photo-semiconductor devices mounted with blue or white LED elements (backlights for liquid crystal displays, traffic lights, outdoor big displays, advertisement sign boards, and the like).

19 Claims, No Drawings

THERMOSETTING COMPOSITION

FIELD OF THE INVENTION

The present invention relates to a thermosetting composition which can be used, for example, as an optical material such as a photosemiconductor element encapsulation agent, an optical adhesive, or an optical coating agent, and a photosemiconductor device obtained by using the composition.

BACKGROUND OF THE INVENTION

Since silicone resin compositions are less likely to undergo discoloration even upon high-temperature use, the silicone resin compositions have been generally used as photosemiconductor element encapsulation agents, optical adhesives, optical coating agents, and the like. However, in a case where a silicone resin is thermally cured in a binary liquid mixture type using a curing agent, there are in general some disadvantages that the silicone resin does not have sufficient handling ability or storage stability, after mixing a liquid silicone resin and a curing agent, that mixing is necessitated upon each use, and that its cost is also high. In view of the above, as an optical material that is usable in a single liquid type, an epoxy silicone that is relatively inexpensive and is capable of forming into a sheet by pre-curing is considered with expectation. For example, a thermosetting resin composition prepared by curing an epoxy silicone or the like with an aluminum compound catalyst has been disclosed (Japanese Patent Laid-Open No. 2007-332314).

SUMMARY OF THE INVENTION

The present invention relates to a thermosetting composition containing an aluminosiloxane and an epoxy silicone; and a photosemiconductor device containing a photosemiconductor element encapsulated with the composition.

DETAILED DESCRIPTION OF THE INVENTION

In some cases, sufficient heat resistance cannot be obtained by merely using an epoxy silicone. In addition, in a case where an epoxy silicone is used as an encapsulation agent for high-output light-emitting diodes, the encapsulation agent is discolored due to heat generated by light-emitting diodes, so that in some cases, brightness may be lowered, in other words, sufficient light fastness may not be obtained.

The present invention relates to a thermosetting composition that gives a cured product having excellent heat resistance and light fastness, and a photosemiconductor device containing a photosemiconductor element encapsulated with the composition.

According to the present invention, a thermosetting composition that gives a cured product excellent in heat resistance and light fastness, and a photosemiconductor device containing a photosemiconductor element encapsulated with the composition can be provided.

These and other advantages of the present invention will be apparent from the following description.

The thermosetting composition of the present invention contains an aluminosiloxane and an epoxy silicone, and a cured product formed by a reaction of an epoxy silicone and an aluminosiloxane via a highly reactive epoxy group can have excellent heat resistance. In addition, the encapsulated photosemiconductor device can have excellent light fastness.

In one embodiment of the present invention, the aluminosiloxane may be a compound having three units of poly(dimethyl siloxanes) each bound to an aluminum atom via an oxygen atom as a backbone, from the viewpoint of compatibility with the epoxy silicone. It is preferable that the aluminosiloxane is a compound represented by the following general formula (I):

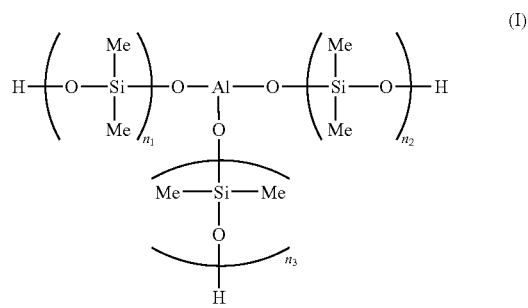

wherein an average of $n_1$ to $n_3$ is from 1 to 160.

The average of $n_1$ to $n_3$ in the general formula (I) is preferably from 1 to 160, and more preferably from 40 to 160. Here, $n_1$, $n_2$, and $n_3$ may take an n that is outside the above range, so long as an average thereof is within the above range, but it is preferable that each of $n_1$, $n_2$, and $n_3$ is within the above range.

As the compound represented by the general formula (I), it is desired to use a compound, for example, obtained by reacting a silicon-containing compound and an aluminum compound that are given below.

The silicon-containing compound includes silanol dual end-capped silicone oils, such as silanol dual end-capped poly(dimethyl siloxanes), silanol single end-capped silicone oils, silanol and disilanol, from the viewpoint of reactivity. Among them, it is preferable to use the silanol dual end-capped silicone oils.

The aluminum compound includes aluminum methoxide, aluminum ethoxide, aluminum isopropoxide, aluminum butoxide, and the like, and these aluminum compounds can be used alone or in a combination of two or more kinds. Among them, it is preferable to use aluminum isopropoxide.

It is preferable that the silicon-containing compound and the aluminum compound used in the synthesis reaction of the compound represented by the general formula (I) are in a weight ratio, i.e. silicon-containing compound/aluminum compound, of from 5/1 to 1000/1.

The reaction of the silicon-containing compound and the aluminum compound can be carried out, for example, at a temperature of from 20° to 100° C. for 1 to 24 hours, while stirring in the absence of a solvent. Thereafter, insoluble substances are removed by centrifugation, and the solution is concentrated under a reduced pressure preferably at a temperature of from 40° to 100° C. for preferably 1 to 6 hours, whereby a compound represented by the general formula (I) can be obtained. The reaction, however, is not limited thereto.

In another embodiment of the present invention, it is preferable that the aluminosiloxane has a photopolymerizable functional group, from the viewpoint of the strength of a cured product. Specifically, the photopolymerizable functional group is a group having an ethylenic double bond, i.e. an acryl group, a methacryl group, or the like. Since the aluminosiloxane has the photopolymerizable functional group, a thermosetting composition can be molded into a sheet-like form in a semi-cured state by a reaction according to photocuring.

It is preferable that the aluminosiloxane having a photopolymerizable functional group is, for example, a compound represented by the following general formula (II):

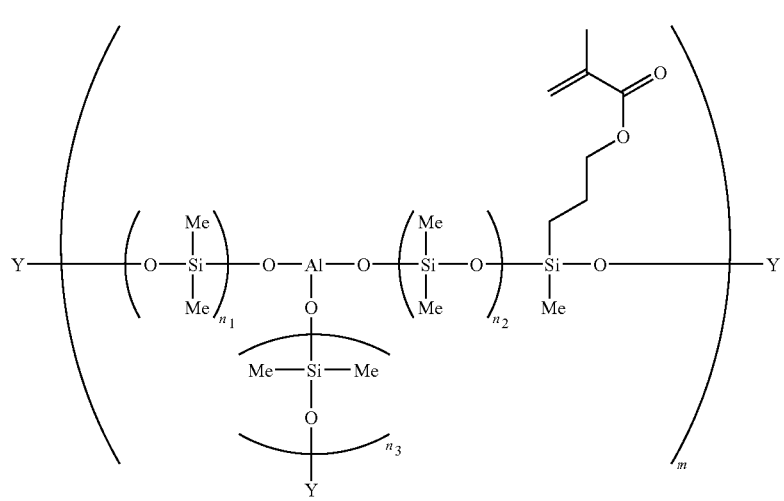

wherein an average of $n_1$ to $n_3$ is from 1 to 160; m is an integer of 1 or more; and Y is H or $CH_3$.

$n_1$ to $n_3$ in the general formula (II) is as defined in $n_1$ to $n_3$ in the above-mentioned general formula (I), and an average thereof is preferably from 1 to 160, and more preferably from 40 to 160. In addition, Y in the general formula (II) is H or $CH_3$, and among them, it is preferable that Y is H.

The production of the compound represented by the general formula (II) include, for example, a method including the steps of adding 3-methacryloxypropylmethyl dimethoxysilane to a compound represented by the general formula (I) (an average of $n_1$ to $n_3$ being from 40 to 160), and heating at 20° to 150° C. under a reduced pressure for 5 minutes to 24 hours, and the present invention is not limited to this method.

The aluminosiloxane is contained in an amount of preferably from 5 to 95% by weight, more preferably from 10 to 90% by weight, and even more preferably from 30 to 70% by weight, of the thermosetting composition, from the viewpoint of reactivity, strength of a cured product, and workability.

The epoxy silicone usable in the present invention may be, for example, a compound having compatibility and reactivity to the aluminosiloxane, and the epoxy silicone may be a compound having an epoxy group in a side chain and/or an end, such as a compound having a dimethylsilicone backbone. Also, the epoxy group may be an alicyclic epoxy group, and specific alicyclic epoxy groups include epoxy cyclohexyl, and the like. It is considered that the epoxy silicone has affinity mutually with the aluminosiloxane, shows compatibility therewith to be homogenized, and also can be cured in a high cross-linking density by a reaction with an aluminosiloxane via a highly reactive epoxy group, so that excellent heat resistance and light fastness can be realized.

The epoxy silicone has an epoxy equivalence of preferably from 500 to 5000 g/mol, and more preferably from 1000 to 5000 g/mol, from the viewpoint of compatibility, reactivity, and strength of the resulting cured product. When the epoxy silicone has an epoxy equivalence of less than 500 g/mol, the compatibility with the aluminosiloxane is likely to be lowered, and when the epoxy silicone has an epoxy equivalence exceeding 5000 g/mol, the reactivity is lowered, so that the resulting cured product is likely to have a lowered strength. In addition, taking the compatibility with the aluminosiloxane into consideration, when an epoxy silicone having an epoxy equivalence of less than 1000 g/mol is used, it is preferable to use a compound represented by the general formula (II).

Commercially available products of the epoxy silicone include a side-chained epoxy silicone having an epoxy group in a side chain, such as KF-1001 of Shin-Etsu Chemical Co., Ltd.; a side chained and end-capped epoxy silicone having epoxy groups in a side chain and an end, such as X-22-9002 of Shin-Etsu Chemical Co., Ltd.; an end-capped epoxy silicone having an epoxy group in an end, such as X-22-169AS of Shin-Etsu Chemical Co., Ltd.; and the like.

The epoxy silicone is contained in an amount of preferably from 5 to 95% by weight, more preferably from 10 to 90% by weight, and even more preferably from 30 to 70% by weight, of the thermosetting composition, from the viewpoint of reactivity, strength of a cured product, and workability.

Besides the aluminosiloxane and the epoxy silicone mentioned above, the thermosetting composition of the present invention may contain an additive, such as a photopolymerization initiator, a cross-linking agent, a cross-linking catalyst, an anti-aging agent, a modifying agent, a surfactant, a dye, a pigment, a discoloration preventive, or an ultraviolet absorbent, within the range that would not impair the effects of the present invention.

The preparation of the thermosetting composition is not particularly limited, and the thermosetting composition can be prepared by mixing the above-mentioned aluminosiloxane and the above-mentioned epoxy silicone, and the like. Alternatively, the thermosetting composition can be prepared by separately preparing the above-mentioned aluminosiloxane and the above-mentioned epoxy silicone, and the like, and mixing the components before use.

The thermosetting composition has a viscosity at 25° C. of preferably from 10 to 20000 mPa·s, and more preferably from 500 to 15000 mPa·s. The viscosity is calculated with a rheometer under the conditions of a temperature of 25° C. and 1 atmospheric pressure.

It is preferable to use the thermosetting composition for a photosemiconductor element encapsulation agent, an optical additive, an optical coating agent, or the like. When the thermosetting composition is used as a photosemiconductor element encapsulation agent, for example, the composition can be encapsulated by heating the composition at a temperature of from 50° to 250° C. for 5 minutes to 24 hours to cure according to an injection molding method. In addition, when a thermosetting composition containing an aluminosiloxane having a photopolymerizable functional group is used, the composition can be encapsulated by irradiating the composition with UV-A rays of from 100 to 10000 mJ/cm$^2$ to mold the composition into a sheet-like form in a semi-cured state, placing a molded product over a subject to be encapsulated, and pressing the molded product at a temperature of from 50° to 250° C. for 5 minutes to 24 hours. The cured product obtained with the thermosetting composition has a thickness of preferably from 10 to 5000 μm, and more preferably from 100 to 1000 μm.

The thermosetting composition is suitably used for, for example, photosemiconductor devices mounted with blue or white LED elements (backlights for liquid crystal displays, traffic lights, outdoor big displays, advertisement sign boards, and the like). Accordingly, the present invention also provides a photosemiconductor device containing a photosemiconductor element encapsulated with the above-mentioned thermosetting composition. The photosemiconductor device can be produced by molding a thermosetting composition into a sheet-like form, and placing a molded product on LED elements, and pressing the molded product, or alternatively heating a thermosetting composition according to an injection molding method placed over a substrate mounted with LED elements under the above-mentioned conditions, to cure.

EXAMPLES

The following examples further describe and demonstrate embodiments of the present invention. The examples are given solely for the purposes of illustration and are not to be construed as limitations of the present invention.

Examples 1 to 6 and Comparative Example 1

Each of the components listed in Table 1 was mixed, thereby giving each of thermosetting compositions of Examples 1 to 6 and Comparative Example 1.

Here, the compound represented by the general formula (I) was obtained as follows. Silanol dual end-capped poly(dimethyl siloxanes) and aluminum isopropoxide were mixed in a weight ratio, i.e. silicon-containing compound/aluminum compound, of 72/1, and reacted at 30° C. for 24 hours in the absence of a solvent, while stirring. Thereafter, the reaction mixture was centrifuged to remove insoluble substances, and the solution was concentrated under a reduced pressure at 50° C. for 2 hours, to give a compound represented by the general formula (I).

In addition, the compound represented by the general formula (II) used in Example 6 was obtained by adding 1.5 g (6.46 mmol) of 3-methacryloxypropylmethyl dimethoxysilane (commercially available from Shin-Etsu Chemical Co., Ltd., KBM502) to 30.0 g of the compound represented by the general formula (I) (average of $n_1$ to $n_3$ being 40), and stirring the mixture under a reduced pressure at 80° C. for 2 hours.

Blue LEDs were encapsulated with each of the resulting thermosetting compositions of Examples 1 to 6 and Comparative Example 1 in the manner described below, to give a photosemiconductor device. In Examples 1 to 5 and Comparative Example 1, blue LEDs were encapsulated according to the injection molding method, and the thermosetting composition was heated at 150° C. for 2 hours to cure (viscosity at 25° C. of a thermosetting composition before curing: 1000 to 6000 mPa·s; thickness of a cured product: 400 μm). In Example 6, a thermosetting composition was irradiated with UV-A rays of 5000 mJ/cm$^2$, the composition was molded into a sheet-like form of a semi-cured state, the sheet was then placed over the blue LEDs and subjected to pressing, and the sheet was heated at 150° C. for 2 hours to cure, thereby encapsulating with the sheet (viscosity at 25° C. of a thermosetting composition before curing: 500 mPa·s; thickness of a cured product: 400 μm).

<Evaluation>

(Heat Resistance)

Each of the thermosetting compositions of Examples 1 to 6 and Comparative Example 1 was applied to a PET film, and heated at 150° C. for 2 hours, to give a cured product having a thickness of 400 μm. The light transmittance at initial stage and the light transmittance after heating at 200° C. for 16 hours for the resulting cured product were determined. One having light transmittance that was lowered by less than 10% as compared to the initial value was evaluated as ○, and one having light transmittance that was lowered by 10% or more was evaluated as x. The results are shown in Table 1. Here, the light transmittance was determined with a spectrophotometer (U-4100, commercially available from Hitachi High-Technologies Corporation) at a wavelength of 400 nm.

(Light Fastness)

An electric current of 600 mA was allowed to flow through each of the photosemiconductor devices obtained using each of the thermosetting compositions of Examples 1 to 6 and Comparative Example 1, and the brightness at the initial stage and the brightness after 100 hours from light-up were determined. One having brightness that was lowered by less than 10% as compared to the initial value was evaluated as ○, and one having brightness that was lowered by 10% or more was evaluated as x. The results are shown in Table 1. Here, the brightness was determined with MCPD (Multi-Channel Photo-Detector System MCPD-3000, commercially available from Otsuka Electronics Co., Ltd.).

TABLE 1

|  |  | Ex. 1 | Ex. 2 | Ex. 3 | Ex. 4 | Ex. 5 | Ex. 6 | Comp. Ex. 1 |
|---|---|---|---|---|---|---|---|---|
| Aluminosiloxane | Average of $n_1$-$n_3$ in Formula (I) | 155 | 155 | 40 | 13 | 2 | — | — |
|  | Average of $n_1$-$n_3$ in Formula (II) | — | — | — | — | — | 40 | — |
|  | Y in Formula (II) | — | — | — | — | — | Copresence of H and CH$_3$ | — |
|  | Parts by Weight | 50 | 50 | 50 | 50 | 30 | 50 | — |
| Epoxy Silicone | Type | Side-Chain[1] | Side-Chain/End-Capped[2] | Side-Chain[1] | Side-Chain[1] | Side-Chain[1] | End-Capped[3] | Side-Chain[1] |
|  | Epoxy Equivalence (g/mol) | 5000 | 3500 | 5000 | 5000 | 5000 | 500 | 5000 |
|  | Parts by Weight | 50 | 50 | 50 | 50 | 70 | 50 | 50 |
| Photopolymerization Initiator[4] | Parts by Weight | — | — | — | — | — | 1 | — |
| Cross-Linking Agent[5] | Parts by Weight | — | — | — | — | — | — | 50 |

TABLE 1-continued

|  | | Ex. 1 | Ex. 2 | Ex. 3 | Ex. 4 | Ex. 5 | Ex. 6 | Comp. Ex. 1 |
|---|---|---|---|---|---|---|---|---|
| Cross-Linking Catalyst[6] | Parts by Weight | — | — | — | — | — | — | 1 |
| | Heat Resistance | ○ | ○ | ○ | ○ | ○ | ○ | x |
| | Light Fastness | ○ | ○ | ○ | ○ | ○ | ○ | x |

Note)
Amount used for each component in Examples is expressed by amount used (parts by weight) when a total amount of the aluminosiloxane and the epoxy silicone is assumed to be 100 parts by weight, and the amount used for each component of Comparative Example is expressed by amount used (parts by weight) when the amount used for the epoxy silicone of the same amount as the epoxy silicone of Example 1 is assumed to be 50 parts by weight.
[1]KF-1001 (commercially available from Shin-Etsu Chemical Co., Ltd.)
[2]X-22-9002 (commercially available from Shin-Etsu Chemical Co., Ltd.)
[3]X-22-169AS (commercially available from Shin-Etsu Chemical Co., Ltd.)
[4]DAROCUR 1173: 2-Hydroxy-2-methyl-1-phenyl-propan-1-one (commercially available from Ciba Specialty Chemicals)
[5]MH-700: 4-Methylhexahydrophthalic anhydride (commercially available from New Japan Chemical Co., Ltd.)
[6]TMB: Trimethoxy boroxine (commercially available from Wako Pure Chemical Industries, Ltd.)

The thermosetting composition of the present invention is suitably used for, for example, photosemiconductor devices mounted with blue or white LED elements (backlights for liquid crystal displays, traffic lights, outdoor big displays, advertisement sign boards, and the like).

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thermosetting composition comprising an aluminosiloxane having three polysiloxane units bound to an aluminum atom via an oxygen atom, and an epoxy silicone,
wherein the aluminosiloxane is present in an amount of from 30 to 95% by weight based on the total weight of the thermosetting composition.

2. The thermosetting composition according to claim 1, wherein the epoxy silicone has an epoxy equivalence of from 500 to 5000 g/mol.

3. The thermosetting composition according to claim 1, wherein the aluminosiloxane has a photopolymerizable functional group.

4. The thermosetting composition according to claim 3, wherein the photopolymerizable functional group is a group having an ethylenic double bond.

5. A photosemiconductor device comprising a photosemiconductor element encapsulated with the thermosetting composition as defined in claim 1.

6. The thermosetting composition according to claim 1, wherein the aluminosiloxane has three poly(dimethylsiloxane) units bound to an aluminum atom via an oxygen atom.

7. The thermosetting composition according to claim 1, wherein the aluminosiloxane has the following formula (I):

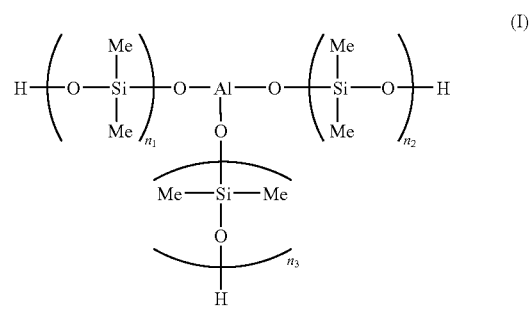

wherein $n_1$, $n_2$ and $n_3$ each have an average value of from 1-160.

8. The thermosetting resin composition according to claim 7 wherein the average value of each of $n_1$, $n_2$ and $n_3$ is from 40-160.

9. The thermosetting resin composition according to claim 3, wherein the photopolymerizable functional group is an acryl group or methacryl group.

10. The thermosetting composition according to claim 1, wherein the aluminosiloxane has the following formula (II):

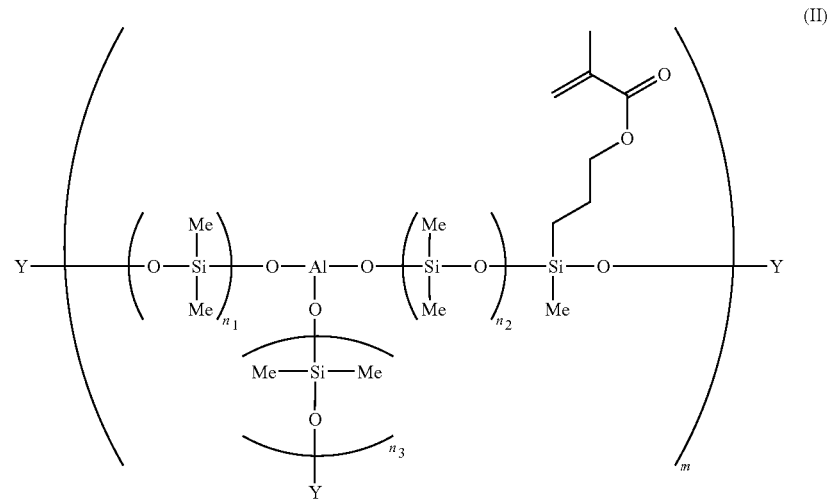

wherein the average value of each of $n_1$, $n_2$ and $n_3$ is from 1-160, m is an integer of 1 or more, and Y is at least one of H and $CH_3$.

11. The thermosetting composition according to claim 10, wherein $n_1$, $n_2$ and $n_3$ each have an average value of 40-160.

12. The thermosetting composition according to claim 11, wherein Y is H.

13. A cured product obtained by curing the thermosetting resin composition according to claim 6.

14. A cured product obtained by curing the thermosetting resin composition according to claim 10.

15. The thermosetting resin composition according to claim 1, wherein the epoxy silicone includes an epoxy group in a side chain or at an end.

16. The thermosetting composition according to claim 1, having a viscosity at 25° C. of from 500-15,000 mPa·s.

17. The thermosetting composition according to claim 1, wherein the aluminosiloxane has three poly(dimethylsiloxane) units bound to the aluminum atom.

18. The thermosetting composition according to claim 1, wherein the aluminosiloxane is present in an amount of from 30 to 70% by weight.

19. The thermosetting composition according to claim 1, wherein the aluminosiloxane is present in an amount of from 50 to 95% by weight.

* * * * *